United States Patent [19]

Hwang et al.

[11] Patent Number: 5,117,391
[45] Date of Patent: May 26, 1992

[54] BIPOLAR MEMORY CELL ARRAY BIASING TECHNIQUE WITH FORWARD ACTIVE PNP LOAD CELL

[75] Inventors: Bor-Yuan Hwang, Tempe; Thomas P. Bushey, Phoenix, both of Ariz.

[73] Assignee: Motorola, Inc., Schaumburg, Ill.

[21] Appl. No.: 533,220

[22] Filed: Jun. 4, 1990

[51] Int. Cl.$^5$ .............................................. G11C 11/40
[52] U.S. Cl. .................................. 365/155; 365/179; 365/190; 365/225.6
[58] Field of Search ............. 365/155, 179, 190, 225.6

[56] References Cited

U.S. PATENT DOCUMENTS

| | | | |
|---|---|---|---|
| 4,618,944 | 10/1986 | Okajima | 365/225.6 |
| 4,697,251 | 12/1985 | Birrittella et al. | 365/154 |
| 4,730,277 | 3/1988 | Stipanuk | 365/189.09 |
| 4,821,234 | 4/1989 | Nakase | 365/225.6 |

OTHER PUBLICATIONS

Wiedmann et al., "Small-Size Low-Power Bipolar Memory Cell", IEEE Journal of Solid-State Circuits vol. SC-6, pp. 355-360.

*Primary Examiner*—Joseph A. Popek
*Assistant Examiner*—Jack A. Lane
*Attorney, Agent, or Firm*—Robert D. Atkins

[57] ABSTRACT

A bipolar memory array arranged in a row and column matrix is responsive to a plurality of word line driver transistors for selecting one row of memory cells thereof. The current flowing through each memory cell is provided by a pair or lateral PNP transistor current source loads. The collectors of the word line driver transistors are commonly connected for distributing the source of collector current flowing therethrough between the bases of all of the laterla PNP transistor current sources of the entire memory array which maintains a constant current flow through each of the memory cells during the select and deselect cycles thereby maintaining a constant memory cell array power dissipation which allows for expanded capacity of the memory array and a performance improvement.

14 Claims, 2 Drawing Sheets

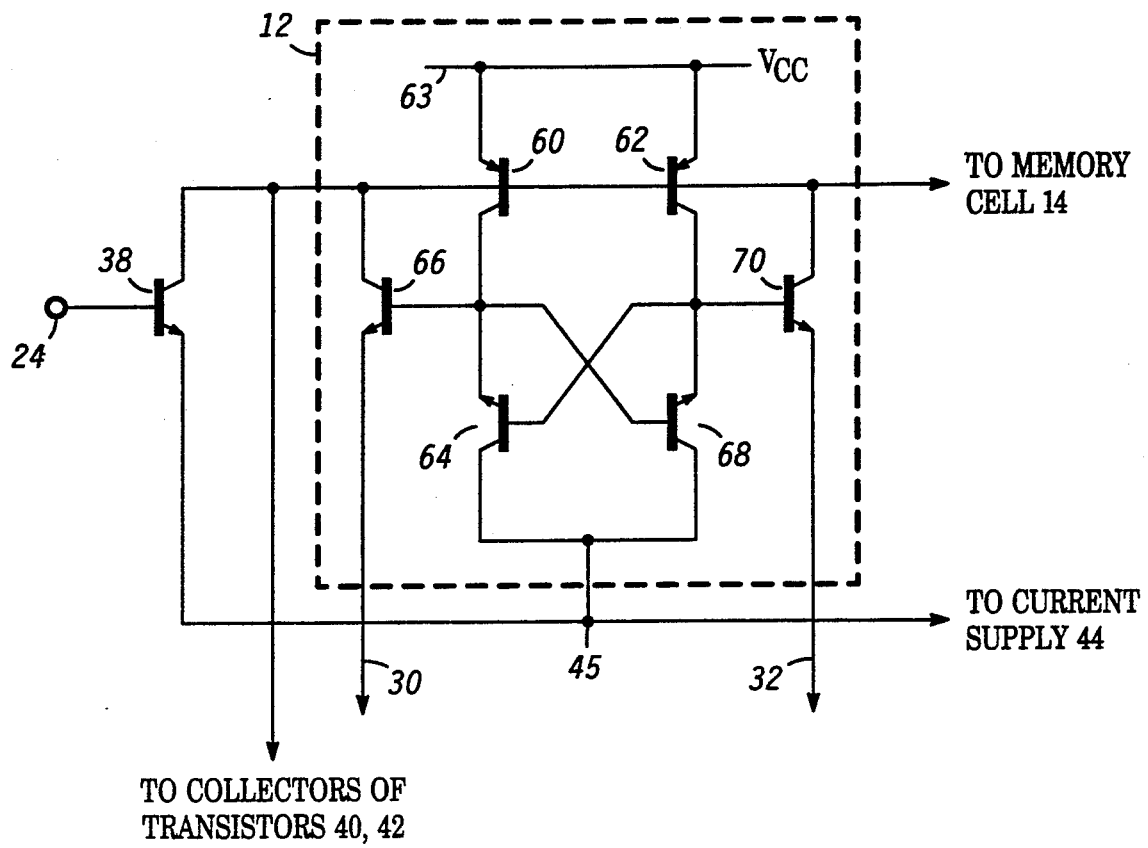
FIG. 2
FIG. 3
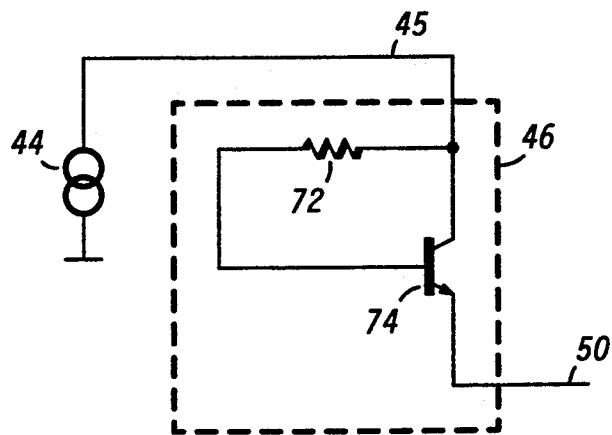

BIPOLAR MEMORY CELL ARRAY BIASING TECHNIQUE WITH FORWARD ACTIVE PNP LOAD CELL

BACKGROUND OF THE INVENTION

This invention relates in general to bipolar memory circuits, and more particularly, to a bipolar memory cell biasing technique for setting the power dissipation level of the memory cell array while achieving higher performance.

The use of bipolar technology for memory cells is well known in the art and appreciated for its high speed performance. One such memory cell, commonly known as Wiedmann/Berger cell, provides an excellent trade-off between cell size, power consumption, cell stability and improved alpha immunity as described in an article entitled "Small Size Low-Power Bipolar Memory Cell" by Siegfried K. Wiedmann and Horst H. Berger, published IEEE Journal, Solid State Circuits, vol. SC-6, pages 283–288, October 1971. With the addition of some innovative circuit techniques the memory cell may also provide excellent read/write performance. Briefly, the Wiedmann/Berger memory cell comprises a common-base pair of lateral PNP transistors operating as current source loads for the collector-emitter conduction paths of another pair of cross-coupled NPN bipolar transistors which store a single bit of data. The cross-coupled bipolar transistors are operated in inverse mode. The collectors of the cross-coupled transistor pairs of every memory cell in a row are coupled together forming a word select line.

In the original Wiedmann/Berger memory cell, the bases of the lateral PNP transistors were biased by a reference voltage which establishes the memory cell standby current while simultaneously operating the PNP transistors as active current source loads. However, because of the exponential relationship between the base-emitter junction potential and the associated collector current flowing through the lateral PNP transistors, the memory cells were susceptible to wide variations in standby current flow and associated power consumption. For example, an 18 millivolt variation in the reference potential translates to a factor of two change in the collector current, say from one microamp to two microamps. Consequently, the memory cell array standby current can easily be doubled due to the variation in reference potential.

More recent versions of the Wiedmann/Berger memory cell include an NPN transistor having a collector coupled to the bases of the lateral PNP transistors and an emitter coupled to the word select line. The collector of the NPN transistor is also coupled to the bases of the lateral PNP transistors of the other memory cells in the same row. The base of the NPN transistor is driven by a word select signal which enables an entire row of memory cells. Thus, the bases of the lateral PNP transistors in the memory cell row are biased by the collector current of the word select driver NPN transistor instead of a reference potential thus providing immunity from variations thereof. In addition, a current source is coupled to the word select line of the memory cell row for providing a kicker current to discharge the selected word line. While this improves the variation of current flowing through the memory cell due to the reference potential instability, it creates a similar problem for the lateral PNP transistors in the selected row as the kicker current is distributed as lateral PNP base current from the selected row. This additional base current develops undesirable charges on the large diffusion and junction capacitances of the lateral PNP transistors which must be discharged thereby slowing cycle time and degrading performance.

Hence, what is needed is an improved bipolar memory circuit which limits the effect of the discharge current flowing through the word select driver NPN transistor upon the lateral PNP transistor current source loads.

SUMMARY OF THE INVENTION

Accordingly, an objective of the present invention is to provide an improved bipolar memory circuit.

Another objective of the present invention is to provide an improved bipolar memory circuit having reduced sensitivity to the discharge current flowing through the word select driver NPN transistor.

Still another objective of the present invention is to provide an improved bipolar memory circuit which combines high density and low standby power dissipation with fast cycle times.

In accordance with the above and other objectives there is provided an improved bipolar memory circuit comprising a plurality of memory cells arranged in a matrix of rows and columns, each row being coupled to one of a plurality of word select lines and each column being coupled between first and second ones of a plurality of bit lines. A plurality of transistors is provided each having a base responsive to a word select signal for selecting one of the rows of memory cells, and an emitter coupled to one of the plurality of word select lines. The collectors of the plurality of transistors are coupled together to the plurality of memory cells for distributing the source of current flowing therethrough which maintains a substantially constant current flow through each of the plurality of memory cells.

BRIEF DESCRIPTION OF THE DRAWINGS

FIG. 2 is an illustration of a single bipolar memory cell; and

FIG. 3 is an illustration of a switching circuit.

DETAILED DESCRIPTION OF THE PREFERRED EMBODIMENT

Figure 1:
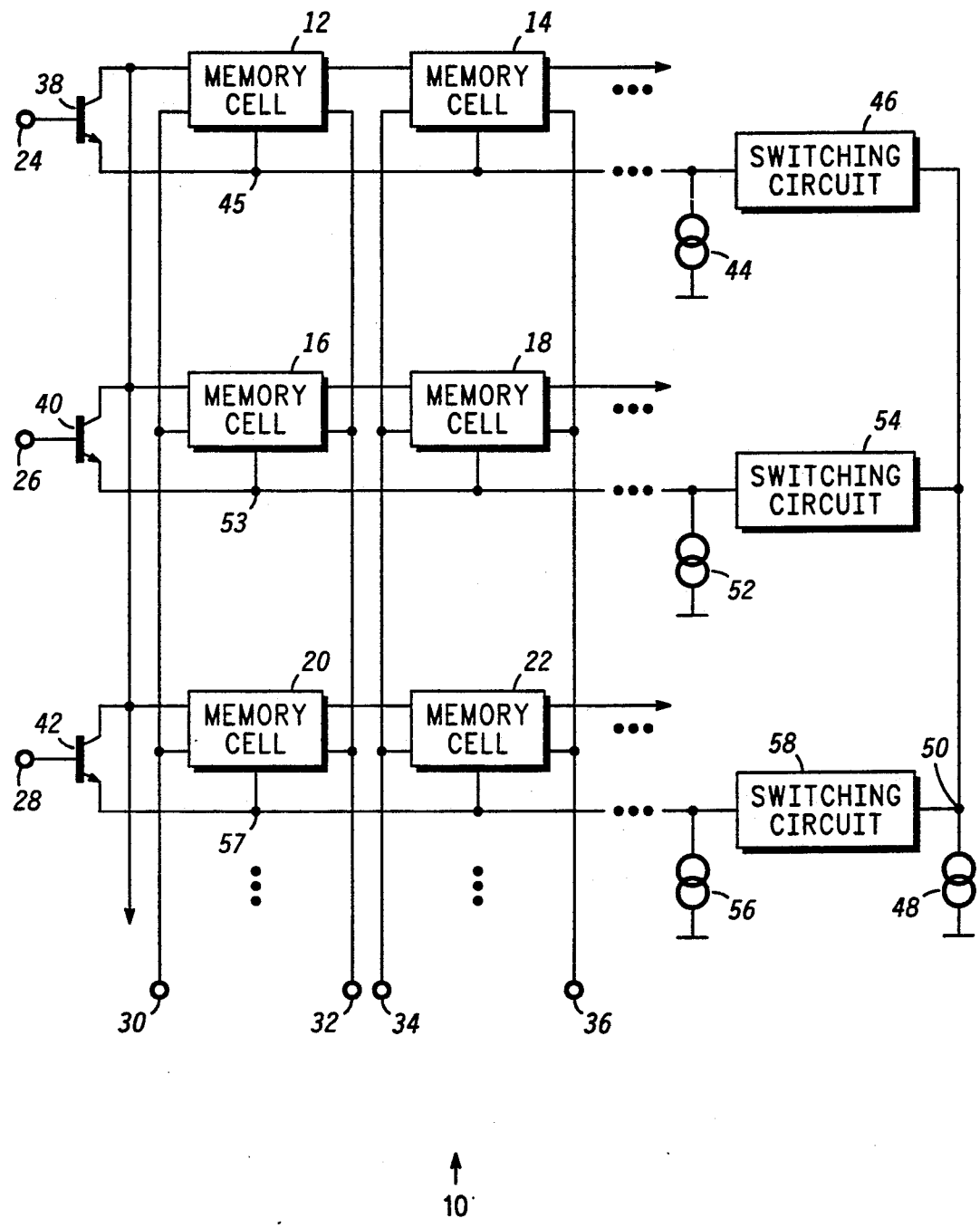
FIG. 1 is a simplified block and schematic diagram of a bipolar memory array illustrating the preferred embodiment of the present invention.

Referring to FIG. 1, there is shown memory array 10 including a plurality of memory cells suitable for manufacturing in monolithic integrated form using conventional integrated circuit processes. The plurality of memory cells include memory cells 12, 14, 16, 18, 20, and 22 arranged in a row/column matrix configuration and responsive to word select signals applied at inputs 24, 26 and 28 for selecting individual rows of memory array 10. In addition, a first bit line left signal and a first bit line right signal are applied through conductors 30 and 32 to memory cells 12, 16 and 20, respectively, while a second bit line left signal and a second bit line right signal are applied through conductors 34 and 36 to memory cells 14, 18, and 22. A particular combination of one word select signal and bit line left and bit line right signals selects the row and column of one memory cell. For example, memory cell 12 may be selected by applying a high word select signal at input 24 while actuating the first bit line left signal and the first bit line right signal at conductors 30 and 32.

Memory array 10 also includes word select driver transistors 38, 40, and 42 responsive to the word select signals for enabling the word select lines and controlling the current flow through the respective memory cells. The collector of transistor 38 is coupled to memory cell 12 and continues to the other memory cells in the same row such as memory cell 14. The emitter of transistor 38 is coupled to current source 44 through word select line 45 which continues through switching circuit 46 to current source 48 at node 50. Likewise, the collector of transistor 40 is coupled to memory cells 16 and 18 while its emitter is coupled to current source 52 via word select line 53. Word select line 53 is also coupled to node 50 through switching circuit 54. The collector of transistor 42 is coupled to memory cells 20 and 22 while the emitter thereof is coupled to current source 56 at word select line 57 and through switching circuit 58 to node 50.

It is understood that memory array 10 may be expanded to include many more memory cells, say 1,000,000 or more, with additional word select driver transistors for each new row while extending the collector conduction paths and word select lines thereof for more memory cells per row.

Turning to FIG. 2, there is shown greater detail of memory cell 12 including lateral PNP transistors 60 and 62 having emitters coupled to power supply conductor 63 typically operating at a ground potential $V_{CC}$. The bases of transistors 60 and 62 are coupled to the collector of transistor 38 which is also extended to the bases of the lateral PNP transistors of memory cell 14. The collector of transistor 60 is coupled to the emitter of transistors 64 and to the base of transistor 66. The emitter and base of transistor 64 are cross-coupled to the base and emitter of transistor 68, respectively, while the emitter of transistor 68 is coupled to the collector of transistor 62 and to the base of transistor 70. The collectors of transistors 64 and 68 are coupled together to the emitter of transistor 38 that is word select line 45. In a like manner, the collectors of the cross-coupled transistor pair of memory cell 14 are coupled together to word select line 45. The collectors of transistors 66 and 70 are coupled to the bases of transistors 60 and 62, while the emitters thereof are coupled to conductors 30 and 32, respectively. Memory cells 14, 16, 18, 20 and 22 follow a similar construction as described.

Switching circuit 46 is shown FIG. 3 including resistor 72 coupled between the collector and base of transistor 74. The collector of transistor 74 is coupled to word select line 45 while the emitter of the same is coupled to node 50 as is true for the emitters of like transistors in switching circuits 54 and 58 which follow a similar construction.

A key feature of memory array 10 is the common node formed between the collectors of the word select driver transistors, that is, the collectors of transistors 38, 40 and 42 are coupled together for distributing the current flow in the bases of the lateral PNP transistors.

The basic operation of memory array 10, less of course the common connection at the collectors of transistors 38, 40 and 42, is thoroughly described in U.S. Pat. No. 4,730,277 by James Stipanuk and assigned to Motorola, Inc. and hereby incorporated by reference. The operation of memory cells 12, 14, 16, 18, 20 and 22 is described in Wiedmann/Berger article noted above and in U.S. Pat. No. 4,697,251 by Mark S. Birrittella et al, assigned to Motorola, Inc., and hereby incorporated by reference. Briefly, memory cell 12 for example is addressed by applying a high word select signal via input 24 at the base of transistor 38 which enables the row of memory cells comprising memory cells 12 and 14. The contents of memory cell 12 may be read at conductors 30 and 32 each being the complement of the other. Alternately, data may be written into memory cell 12 by applying complementary bit line left and bit line right signals at conductors 30 and 32 as is understood. Moreover with transistor 38 selected, the contents of memory cell 14 may be read from and written to via conductors 34 and 36. The other rows of memory cells are activated by the respective word select driver transistors, e.g., transistor 40 enables memory cells 16 and 18 while transistor 42 selects memory cells 20 and 22.

When the word select signal applied at input 24 is low, memory cells 12 and 14 are deselected and a standby current sunk by current source 44 still flows through the row of memory cells thereby maintaining the logic state thereof. Likewise, current supplies 52 and 56 conduct standby current through memory cells 16–18 and 20–22, respectively. The standby current is typically low value, say one microamp, just enough to keep the memory cells active and the data stored.

The process of reading and writing data to a memory cell includes the steps of selecting the desired memory cell row, actuating the appropriate bit line left and bit line right signals and then deselecting the memory cell row. Typically, the logic circuit supplying the word select signals (not shown) is such that one and only one word select signal is always high. To select the row comprising memory cells 12 and 14, the word select signal applied at input 24 is raised to select transistor 38, assuming that it is not already high, which increases the potential at word select line 45 and turns on transistor 74 of switching circuit 46. This enables the conduction path for current source 48 drawing current, typically between two and five milliamps, through memory cells 12 and 14 and transistor 38. Following the read or write operation, the word select signal at input 24 may drop low in order to select another row thereby deselecting transistor 38; however, current source 48 continues to conduct current since word select line 45 is heavily capacitively charged because of the number of memory cells coupled thereto. The potential developed at word select line 45 must be rapidly discharged by the current flowing through current source 48 and to a much lesser extent by current source 44 in order to maintain the high speed performance characteristics for memory cell 12. As the potential at word select line 45 discharges below the cutin threshold of transistor 74, the current flowing through current source 48 is cutoff from word select line 45 leaving only the standby current of current source 44 to maintain memory cells 12 and 14. The current provided by current source 48 then flows through the word select line of another memory cell row now enabled. Thus, current source 48 is important for decreasing the select/deselect cycle time to say one nanosecond or less and increasing the speed of the memory cells.

During the select time when transistor 38 is conducting, a portion of the current supplied by current source 48 flows through the collector-emitter conduction path of transistor 38 and consequently through the bases of the lateral PNP transistors of memory cells 12 and 14, such as transistors 60 and 62, since they collectively source its collector current. This could significantly increase the current flow through the collector-emitter conduction paths of transistors 64 and 68 and cause excessive peak power consumption if not for the improvement provided in the present invention wherein the collectors of word select driver transistors 38, 40 and 42 are coupled together thereby distributing the source of collector current flowing through transistor 38 between the bases of the lateral PNP transistors of all of the memory cells in the entire memory array 10. This significantly reduces the effect of current source 48 upon the base-emitter junctions of the lateral PNP transistors and establishes a constant value for the current flow through the memory cells during the select and deselect periods. Thus, the collector current flowing through the word select driver transistor does not unduly influence the lateral PNP current sources of the selected row because it is evenly distributed between all of the lateral PNP current sources of memory array 10 and, since one of the word select signals is continuously active, the base currents thereof are constant whether one particular memory cell is selected or not. The actual value of base current for any lateral PNP transistor pair is equal to the collector current flowing through the enabled word select driver NPN transistor divided by the number of memory cells in memory array 10.

Recall that the lateral PNP transistors of the prior art are subjected to only small standby currents during deselection and large collector currents during selection causing wide variation over the cycle and limiting the performance of the memory array. By connecting the collectors of transistors 38, 40 and 42 to a common node, the current flowing through the lateral PNP transistors is constant and small albeit slightly higher than the standby current contribution. Furthermore, since the diffusion and junction capacitances of the lateral PNP transistors are no longer excessively charged by the kicker current source 48. Thus by maintaining the current flow through the memory cells at a small constant value, it is possible to increase the density and size of memory array 10 and provide 1,000,000 or more bits of storage on a single integrated circuit chip. Indeed as more memory cells are added, the effect of current source 48 is reduced even further given the larger distribution base, although there is a practical limit on the size of memory array 10 as each additional memory cell consumes a finite amount of power.

Hence, what has been described is a novel bipolar memory circuit including a plurality of word select driver transistors, one for each row of memory cells, wherein the collectors of the word select driver transistors are coupled together for distributing the source of collector current flowing therethrough between the bases of all of the lateral PNP current sources in the memory array and establishing a constant current flow through the memory cells thereby minimizing the standby power variation which allows for expanded capacity of the memory array and performance improvement.

We claim:

1. A memory circuit, comprising:
   a plurality of bit lines;
   a plurality of word lines;
   a plurality of memory cells arranged in a matrix of rows and columns, each row of memory cells being coupled to one of said plurality of word lines and each column of memory cells being coupled between first and second ones of said plurality of bit lines such that asserting one of said plurality of word lines selects a row of memory cells and asserting first and second ones of said plurality of bit lines selects one memory cell of said row of memory cells, each of said plurality of memory cells conducting a load current and having a port for receiving a bias signal to control the magnitude of said load current;
   first current supply means having a plurality of outputs respectively coupled to said plurality of word lines for sinking a plurality of currents, each of said plurality of currents having a first magnitude when said row of memory cells is selected and a second magnitude when said row of memory cells is deselected; and
   a plurality of transistors each having a base, an emitter and a collector, each of said bases being responsive to a word select signal for selecting one of said rows of memory cells, each of said emitters being coupled to one of said plurality of word lines, each of said collectors of said plurality of transistors being coupled together at a common node to said ports of said plurality of memory cells for developing said bias signal and sourcing a difference current equal to the difference between said first and second magnitudes of said plurality of currents into one of said plurality of word lines associated with said selected one of said rows of memory cells which distributes said difference current evenly between said plurality of memory cells and maintains said bias signal constant and said load current flowing through each of said plurality of memory cells constant.

2. The memory circuit of claim 1 wherein said first current supply means comprises:
   a plurality of current sink circuits each having an output coupled to one of said plurality of word lines for providing one of said plurality of currents having said first magnitude when deselected which maintains said row of memory cells in standby mode;
   second current supply means for providing a second current of predetermined magnitude; and
   a plurality of switching circuits respectively coupled between said plurality of word lines and said second current supply means such that one of said plurality of switching circuits closes when said row of memory cells is selected to sink said second magnitude of said one of said plurality of currents as a sum of said second current and said first magnitude of said one of said plurality of currents.

3. The memory circuit of claim 2 wherein one of said plurality of memory cells comprises:
   a first transistor having a base, an emitter and a collector, said base being coupled to said common node, said emitter being coupled to a first source of operating potential;
   a second transistor having a base, an emitter and a collector, said base being coupled to said common node, said emitter being coupled to said first source of operating potential;
   a third transistor having a base, an emitter and a collector, said base being coupled to said collector of said second transistor, said emitter being coupled to said collector of said first transistor, said collector being coupled to said one of said plurality of word lines; and a fourth transistor having a base, an emitter and a collector, said base being coupled to said collector of said first transistor, said emitter being coupled to said collector of said second transistor, said collector being coupled to said one of said plurality of word lines.

4. The memory circuit of claim 3 wherein one of said plurality of memory cells further comprises:
a fifth transistor having a base, an emitter and a collector, said base being coupled to said collector of said first transistor, said collector being coupled to said base of said first transistor, said emitter being coupled to said first one of said plurality of bit lines; and
a sixth transistor having a base, an emitter and a collector, said base being coupled to said collector of said second transistor, said collector being coupled to said base of said second transistor, said emitter being coupled to said second one of said plurality of bit lines.

5. The memory circuit of claim 4 wherein one of said plurality of switching circuits comprises:
a seventh transistor having a base, an emitter and a collector, said collector being coupled to said one of said plurality of word lines, said emitter being coupled to said second current supply means; and
a resistor coupled between said collector and base of said seventh transistor.

6. An integrated bipolar memory circuit for selecting a row of memory cells in an array of memory cells, comprising:
a plurality of bit lines;
a purality of word lines;
a plurality of memory cells arranged in a matrix of rows and columns, each row of memory cells being coupled to one of said plurality of word lines and each column of memory cells being coupled between first and second ones of said plurality of bit lines such that asserting one of said plurality of word lines selects a row of memory cells and asserting first and second ones of said plurality of bit lines selects one memory cell of said row of memory cells, each of said plurality of memory cells conducting a load current and having a port for receiving a bias signal to control the magnitude of said load current, wherein each of said plurality of memory cells includes;
(a) first and second transistors each having a base, an emitter and a collector, said emitters being coupled together to a first source of operating potential, said bases of said first and second transistors being coupled together to a common node,
(b) a third transistor having a base, an emitter and a collector, said base being coupled to said collector of said second transistor, said emitter being coupled to said collector of said first transistor, said collector being coupled to said one of said plurality of word lines, and
(c) a fourth transistor having a base, an emitter and a collector, said base being coupled to said collector of said first transistor, said emitter being coupled to said collector of said second transistor, said collector being coupled to said one of said plurality of word lines;
first current supply means having a plurality of outputs respectively coupled to said plurality of word lines for sinking a plurality of currents, each of said plurality of currents having a first magnitude when said row of memory cells is selected and a second magnitude when said row of memory cells is deselected; and
a plurality of transistors each having a base, an emitter and a collector, each of said bases being responsive to a word select signal for selecting one of said rows of memory cells, each of said emitters being coupled to one of said plurality of word lines, each of said collectors of said plurality of transistors being coupled together at said common node to said ports of said plurality of memory cells for developing said bias signal and sourcing a difference current equal to the difference between said first and second magnitudes of said plurality of currents into one of said plurality of word lines associated with said selected one of said rows of memory cells which distributes said difference current evenly between said plurality of memory cells and maintains said bias signal constant and said load current flowing through each of said plurality of memory cells constant.

7. The bipolar memory circuit of claim 6 wherein said first current supply means comprises:
a plurality of current sink circuits each having an output coupled to one of said plurality of word lines for providing one of said plurality of currents having said first magnitude when deselected which maintains said row of memory cells in standby mode;
second current supply means for providing a second current of predetermined magnitude; and
a plurality of switching circuits respectively coupled between said plurality of word lines and said second current supply means such that one of said plurality of switching circuits closes when said row of memory cells is selected to sink said second magnitude of said one of said plurality of currents as a sum of said second current and said first magnitude of said one of said plurality of currents.

8. The bipolar memory circuit of claim 7 wherein one of said plurality of memory cells further comprises:
a fifth transistor having a base, an emitter and a collector, said base being coupled to said collector of said first transistor, said collector being coupled to said base of said first transistor, said emitter being coupled to said first one of said plurality of bit lines; and
a sixth transistor having a base, an emitter and a collector, said base being coupled to said collector of said second transistor, said collector being coupled to said base of said second transistor, said emitter being coupled to said second one of said plurality of bit lines.

9. The bipolar memory circuit of claim 8 wherein one of said plurality of switching circuits comprises:
a seventh transistor having a base, an emitter and a collector, said collector being coupled to said one of said plurality of word lines, said emitter being coupled to said second current supply means; and
a resistor coupled between said collector and base of said seventh transistor.

10. A matrix of memory cells wherein each memory cell is coupled for receiving one of a plurality of word lines and first and second ones of a plurality of bit lines for selecting the memory cell such that asserting one of the plurality of word lines selects a row of memory cells and asserting first and second ones of the plurality of bit lines selects one memory cell of the row of memory cells, each of the matrix of memory cells conducting a load current and having a port for receiving a bias signal to control the magnitude of the load current, the matrix of memory cells comprising:

first current supply means having a plurality of outputs respectively coupled to the plurality of word lines for sinking a plurality of currents, each of said plurality of currents having a first magnitude when the row of memory cells is selected and a second magnitude when the row of memory cells is deselected; and a plurality of transistors each having a base, an emitter and a collector, each of said bases being responsive to a word select signal for selecting one of the rows of memory cells, each of said emitters being coupled to one of the plurality of word lines, each of said, collectors of said plurality of transistors being coupled together at a common node to said ports of the matrix of memory cells for developing the bias signal and sourcing a difference current equal to the difference between said first and second magnitudes of said plurality of currents into one of the plurality of word lines associated with said selected one of the rows of memory cells which distributes said difference current evenly between the memory cells and maintains the bias signal constant and the load current flowing through each of the matrix of memory cells constant.

11. The memory cells of claim 10 wherein said first current supply means comprises:

a plurality of current sink circuits each having an output coupled to one of said plurality of word lines for providing one of said plurality of currents having said first magnitude when deselected which maintains said row of memory cells in standby mode;

second current supply means for providing a second current of predetermined magnitude; and a plurality of switching circuits respectively coupled between said plurality of word lines and said second current supply means such that one of said plurality of switching circuits closes when said row of memory cells is selected to sink said second magnitude of said one of said plurality of currents as a sum of said second current and said first magnitude of said one of said plurality of currents.

12. The memory cells of claim 11 wherein one of the matrix of memory cells comprises:

a first transistor having a base, an emitter and a collector, said base being coupled to said collectors of said plurality of transistors, said emitter being coupled to a first source of operating potential;

a second transistor having a base, an emitter and a collector, said base being coupled to said collectors of said plurality of transistors, said emitter being coupled to said first source of operating potential;

a third transistor having a base, an emitter and a collector, said base being coupled to said collector of said second transistor, said emitter being coupled to said collector of said first transistor, said collector being coupled to the one of the plurality of word lines; and a fourth transistor having a base, an emitter and a collector, said base being coupled to said collector of said first transistor, said emitter being coupled to said collector of said second transistor, said collector being coupled to the one of the plurality of word lines.

13. The memory circuit of claim 12 wherein one of the matrix of memory cells further comprises:

a fifth transistor having a base, an emitter and a collector, said base being coupled to said collector of said first transistor, said collector being coupled to said base of said first transistor, said emitter being coupled to the first one of the plurality of bit lines; and a sixth transistor having a base, an emitter and a collector, said base being coupled to said collector of said second transistor, said collector being coupled to said base of said second transistor, said emitter being coupled to the second one of the plurality of bit lines.

14. The memory circuit of claim 13 wherein one of said plurality of switching circuits comprises:

a seventh transistor having a base, an emitter and a collector, said collector being coupled to the one of the plurality of word lines, said emitter being coupled to said second current supply means; and a resistor coupled between said collector and base of said seventh transistor.

* * * * *